US007771530B2

(12) United States Patent
Virbulis et al.

(10) Patent No.: US 7,771,530 B2
(45) Date of Patent: Aug. 10, 2010

(54) PROCESS AND APPARATUS FOR PRODUCING A SILICON SINGLE CRYSTAL

(75) Inventors: Janis Virbulis, Burghausen (DE); Wilfried Von Ammon, Hochburg/Ach (AT); Erich Tomzig, Burgkirchen (DE); Yuri Gelfgat, Jurmala (LV); Lenoid Gorbunov, Riga (LV)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 10/053,446

(22) Filed: Jan. 17, 2002

(65) Prior Publication Data
US 2002/0092461 A1 Jul. 18, 2002

(30) Foreign Application Priority Data
Jan. 18, 2001 (DE) ................. 101 02 126

(51) Int. Cl.
 *C30B 15/00* (2006.01)
(52) U.S. Cl. ............... 117/32; 117/13; 117/30
(58) Field of Classification Search ............ 117/32, 117/30, 13
See application file for complete search history.

(56) References Cited
U.S. PATENT DOCUMENTS

| 4,808,079 | A | * | 2/1989 | Crowley et al. ............. 417/50 |
| 4,905,756 | A | * | 3/1990 | Lari et al. ................. 164/467 |
| 5,178,720 | A | | 1/1993 | Frederick |
| 5,196,085 | A | * | 3/1993 | Szekely et al. ............. 117/208 |
| 5,779,791 | A | | 7/1998 | Korb et al. |
| 6,001,170 | A | | 12/1999 | Tomzig et al. |
| 6,053,974 | A | * | 4/2000 | Luter et al. ................ 117/200 |
| 6,077,343 | A | * | 6/2000 | Iida et al. .................... 117/2 |
| 6,086,671 | A | * | 7/2000 | Kawanishi et al. ............ 117/30 |
| 6,139,625 | A | * | 10/2000 | Tamatsuka et al. ............ 117/19 |
| 6,200,384 | B1 | | 3/2001 | Kishida et al. |
| 6,284,384 | B1 | * | 9/2001 | Wilson et al. ............... 428/450 |
| 6,365,461 | B1 | | 4/2002 | Asayama et al. |
| 6,636,037 | B1 | * | 10/2003 | Ou-Yang .................... 324/240 |

FOREIGN PATENT DOCUMENTS

| DE | 3701733 | | 8/1988 |
| DE | 3701733 | A * | 8/1988 |
| DE | 3701811 | A * | 8/1988 |

(Continued)

OTHER PUBLICATIONS

Patent abstracts of Japan. Abstract of JP 62-070286 (1987).*

(Continued)

*Primary Examiner*—Robert M Kunemund
*Assistant Examiner*—Matthew J Song
(74) *Attorney, Agent, or Firm*—Brooks Kushman P.C.

(57) ABSTRACT

A process for producing a silicon single crystal is by pulling the single crystal from a silicon melt which is contained in a crucible with a diameter of at least 450 mm, above which a heat shield is arranged. The single crystal being pulled has a diameter of at least 200 mm. The silicon melt is exposed to the influence of a traveling magnetic field which exerts a substantially vertically oriented force on the melt in the region of the crucible wall. There is also an apparatus which is suitable for carrying out the process.

1 Claim, 4 Drawing Sheets

FOREIGN PATENT DOCUMENTS

| | | |
|---|---|---|
| DE | 19935184 | 2/2000 |
| GB | 1347108 | 2/1974 |
| JP | 60-264391 | 12/1985 |
| JP | 61029128 A * | 2/1986 |
| JP | 62070286 A * | 3/1987 |
| JP | 63-060189 | 3/1988 |
| JP | 63-210092 | 8/1988 |
| JP | 03-051673 | 6/1991 |
| JP | 05-194077 | 8/1993 |
| JP | 10-095698 | 4/1998 |
| JP | 10-167891 | 6/1998 |
| JP | 2000-109395 | 4/2000 |
| JP | 2000-272992 | 10/2000 |
| JP | 2001-106594 | 4/2001 |

OTHER PUBLICATIONS

Patent Abstract of Japan. English Abstract of JP 61-029128 (1986).*
Derwent. English Abstract of DE 3701811 (1988).*
Derwent. English Abstract of DE 3701733 (1988).*
Schreiber Translations, English Translation of DE 3701733 A1, (2005).*
Schreiber Translations, English Translation of DE 3701811 A1, (2005).*
English Derwent Abstract AN 1988-220848 corresponding to DE 3701733.
Giess E.A. et al., Combination Heater Magnetic Solenoid Coil(s) for Suppressing Melt Convection, Feb. 1, 1984, p. 4716.
Patent Abstract of Japan corresponding to JP60-264391.

* cited by examiner

PROCESS AND APPARATUS FOR PRODUCING A SILICON SINGLE CRYSTAL

BACKGROUND OF THE INVENTION

1. Field of the Invention

The present invention relates to a process for producing a silicon single crystal, by pulling the silicon single crystal from a silicon melt which is contained in a crucible and is exposed to the influence of a traveling magnetic field. The invention also relates to an apparatus which is suitable for carrying out the process.

2. The Prior Art

DE-37 01 733 A1 describes a process of the abovementioned type. The traveling magnetic field is used to reduce the extent to which oxygen is included in the single crystal.

SUMMARY OF THE INVENTION

By contrast, the present invention pursues different, in some cases contradictory objectives. It relates to a process for pulling silicon single crystals which have a diameter of at least 200 mm, in particular silicon single crystals belonging to the most modern generation, with diameters of 300 mm and above. The production of crystals of this type requires overcoming a series of problems. One of the primary objectives is to improve the yield by reducing the dislocation frequency. Another objective relates to the pulling rate, which for reasons of productivity should be as high as possible but, on the other hand, cannot be increased arbitrarily. This is because the single crystal cannot grow in the desired cylindrical shape at all pulling rates. A further objective is to be able to satisfy the requirements of manufacturers of electronic components, who would like to predetermine the concentration of oxygen in the single crystal within a wide range. This requires the manufacturer of the silicon single crystal to be able to ensure relatively high concentrations of oxygen in the silicon single crystal if such concentrations are demanded on account of the advantageous gettering action of the oxygen.

The present invention relates to a process for producing a silicon single crystal, by pulling the silicon single crystal from a silicon melt which is contained in a crucible with a diameter of at least 450 mm, above which a heat shield is arranged, the silicon single crystal being pulled with a diameter of at least 200 mm and the melt being exposed to the influence of a traveling magnetic field which exerts a substantially vertically oriented force on the melt in the region of the crucible wall.

The invention also relates to an apparatus for pulling a silicon single crystal, comprising a crucible with a diameter of at least 450 mm, a silicon melt which is contained in the crucible, a heater device arranged around the crucible, a heat shield arranged above the crucible and a device for generating a traveling magnetic field which, in the region of the crucible wall, exerts a substantially vertically oriented force on the melt.

As the inventors have discovered, the invention makes it possible to improve yields, increase the pulling rate, raise the oxygen concentration in the silicon single crystal and shift the position of an OSF ring outward for a predetermined pulling rate. An OSF ring is an annular region of a silicon semiconductor wafer which has been separated from the single crystal. This region serves as a boundary which separates two defect types, namely interstitial defects and voids, from one another. It is advantageous if the OSF ring is at the edge of the semiconductor wafer, since the wafer is then dominated by only one of the two types of defect.

The process of the invention has a further advantage which is realized during the pulling of the seed crystal, i.e. in the initial phase of pulling of the crystal, during which a seed crystal is brought into contact with the melt and the crystal growth is commenced. The risk of dislocations being formed is particularly great in this phase. It has been found that the traveling magnetic field reduces the dislocation frequency. Furthermore, the traveling magnetic field is also useful when melting silicon and when stabilizing the melt before the pulling of the seed, since both operations can be accelerated. The reasons for this are improved mixing of the melt and reduced temperature fluctuations in the melt.

Surprisingly, the effect of the oxygen levels being reduced, which is described in DE-37 01 733 A1, does not occur when the invention is carried out in accordance with a first embodiment. It is assumed that the reason for this is that, when a single crystal is being pulled in accordance with DE-37 01 733 A1, the upwardly directed thermal convection is decelerated by applying a traveling magnetic field with the force directed downward. Consequently, the flow velocity which is responsible for the oxygen transport and the inclusion of oxygen in the silicon single crystal is slowed by the influence of the magnetic field. Therefore a larger quantity of oxygen can escape via the surface of the melt in the form of SiO, and accordingly less oxygen is included in the single crystal.

By contrast, in the present invention it is not the rate of flow, but rather it is the direction of flow, which plays the decisive role. When pulling a silicon single crystal with a diameter of at least 200 mm out of a crucible with a diameter of at least 450 mm, with a traveling magnetic field applied with its force directed downward (first embodiment of the invention), the direction of flow is no longer directed upward, toward the surface of the melt. Rather, convection is established, which is initially directed toward the bottom of the crucible and later toward the growing single crystal. As a result, oxygen is included in the growing silicon single crystal at a virtually constant rate. This occurs even though a crucible promotes the evaporation of SiO out of the melt, since it allows a relatively large open surface of the melt to be used.

Even though a heat shield is used which promotes the evaporation of SiO out of the melt, it does this by increasing the temperature of the melt surface. Even though a gas flow promotes the evaporation of SiO out of the melt, it does this by continuously carrying away the escaping SiO, and can be guided toward the melt surface. Accordingly, it has also been discovered that it is possible to reduce the inclusion of oxygen in the silicon single crystal if the action of the traveling magnetic field, in the region of the crucible wall, is directed upward (second embodiment of the invention).

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
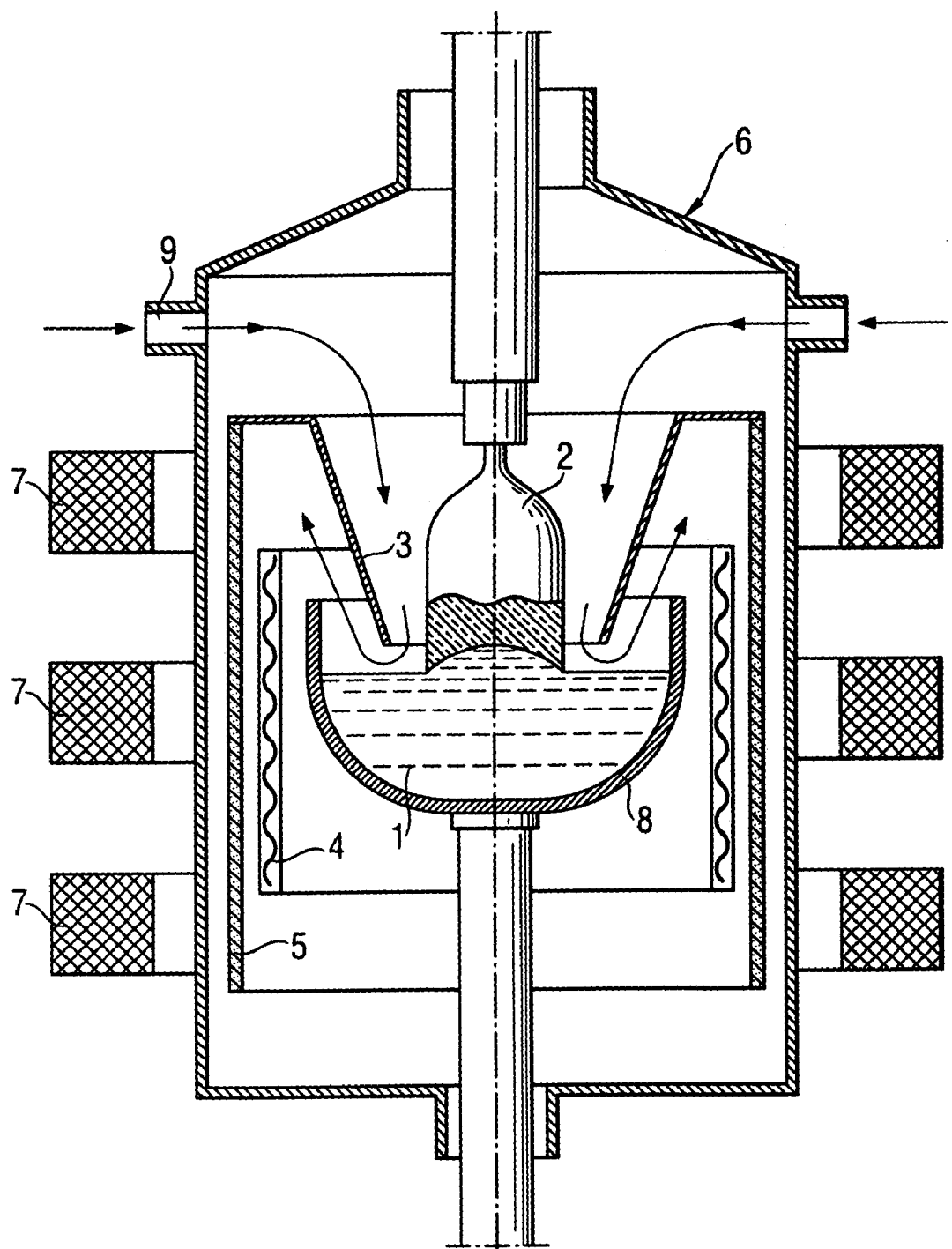
FIG. 1 shows a diagrammatic sectional illustration of a particularly preferred apparatus for pulling a single crystal.

Turning now in detail to the drawings, the apparatus shown in FIG. 1 comprises a receptacle 6 in which a crucible 8, a device 4 for heating the crucible and an insulation 5 are accommodated. The insulation shields the wall of the receptacle from the radiant heat of the heater device 4 and forms a support for a heat shield 3 which is arranged above the crucible. The heat shield thermally shields the growing silicon single crystal 2, which is pulled from a silicon melt 1 contained in the crucible, and also serves to guide and limit a gas flow which is supplied by a device 9. The gas flow is directed toward the surface of the melt and flushes silicon oxide which evaporates from the melt out of the area above the crucible. Suitable gases are in particular inert gases, such as for example argon or nitrogen and mixtures of such gases. Hydrogen may also be present as a constituent of the gas flow. The crucible has a diameter of at least 450 mm and therefore produces a relatively large open surface area of the melt.

Two or more coils of a magnetic device 7, which are supplied with alternating electric current, are arranged around the receptacle 6, so that the melt in the crucible is under the influence of a traveling magnetic field. The wall of the receptacle must transmit the magnetic field at least in the area between the magnetic device and the melt. This can be ensured by selecting a low frequency of the field or by forming the wall of the receptacle from material with a poor electrical conductivity, for example quartz or ceramic. Although it is preferable for the magnetic device to be arranged outside the receptacle, for space reasons, this is not absolutely imperative. Therefore, the magnetic device may also be arranged between the crucible and the heater device. It is also possible, for example, for the heater device to be designed as a helical multiphase inductor which additionally fulfils the function of the magnetic device, so that there is no need for a separate magnetic device.

According to a preferred embodiment of the invention, the magnetic device 7 comprises three coils which are connected to a 3-phase power supply. The coils may be connected both in a star-shaped circuit and in a triangular circuit. A traveling magnetic field which, in the region of the crucible wall, exerts a downwardly or upwardly directed force on the melt is generated by suitable selection of the order of connections. The connections of the coils expediently have a phase angle in the order 0°-60°-120° or 0°-120°-240°, the latter arrangement being preferred. The force which is produced by the magnetic field in the melt is, for example, directed downward, toward the base of the crucible, in the region of the crucible wall (first embodiment of the invention) if the lower coil is connected with a 0° phase, the middle coil is connected with a 120° phase and the upper coil is connected with a 240° phase. The force is directed upward (second embodiment of the invention) if the phase angle of the lower and upper coils is reversed. The number of turns of the coils is typically from 20 to 40 turns per coil and is preferably the same for all of the coils used or at least for two of the coils used. The intensity of the magnetic field applied to the melt is preferably from 1 to 15 mT, corresponding to approximately 800 to 12000 ampere turns.

As demonstrated by Example 2 below, the inclusion of oxygen in the single crystal is increased if the force of the magnetic field is directed downward. If the force generated by the magnetic field is oppositely directed, i.e. is directed upward, the inclusion of oxygen is reduced. In both cases, however, the influence of the traveling magnetic field improves the yield. The reason for this lies in attenuation of low-frequency temperature fluctuations, even though such fluctuations are particularly pronounced in crucibles with diameters of at least 450 mm and are further reinforced by the use of a heat shield. This is an unexpectedly surprising result, since the convection in the melt, when a traveling magnetic field is applied, increases with the intensity of the magnetic field, and rate fluctuations are increased. However, it is apparently the low-frequency temperature fluctuations which are in fact responsible for dislocations, which reduce the yield.

EXAMPLE 1

Figure 2:
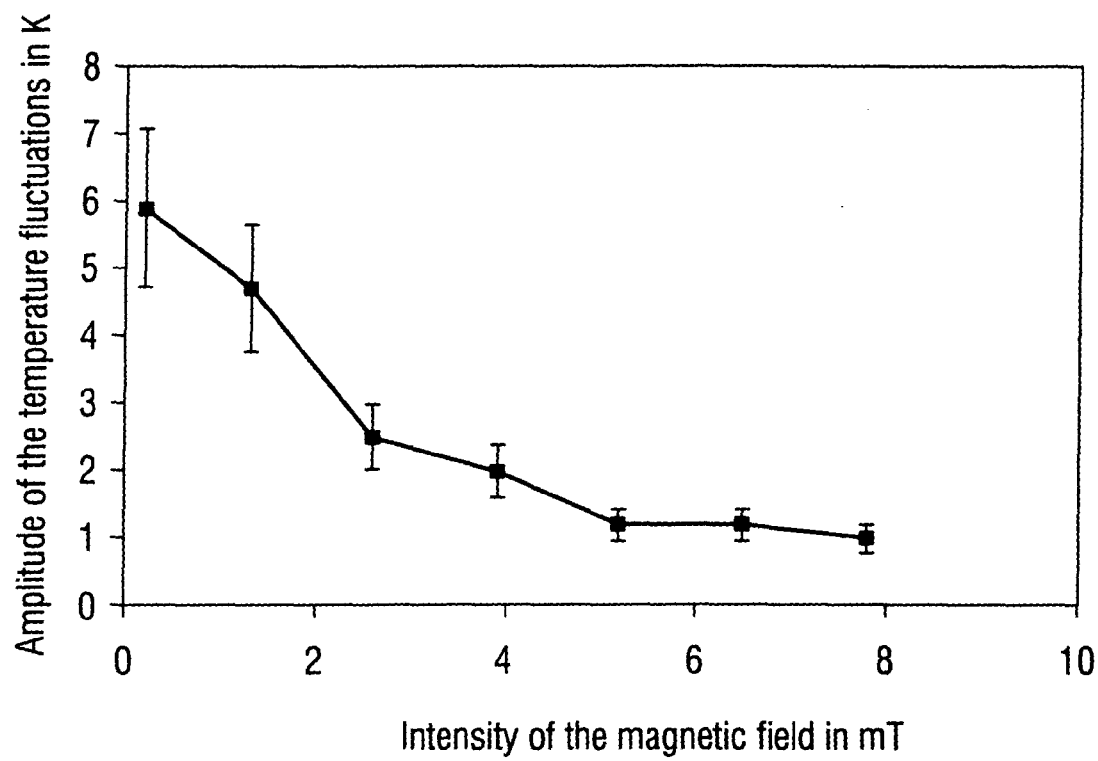
FIG. 2 shows a diagram in which the amplitude of low-frequency temperature fluctuations in the melt is plotted against the intensity of the traveling magnetic field which has been applied to the melt.

An apparatus as shown in FIG. 1 having three coils with 36, 40 and 36 turns, connected with phase angles of 0°-120°-240°, was used. The temperature of the melt was measured using submerged thermocouples. The crucible used had a diameter of 14 inches and contained 20 kg of silicon. FIG. 2 shows how low-frequency temperature fluctuations in the melt decrease as the intensity of the magnetic field rises. An intensity of 6 mT corresponds to a current intensity of 81 A.

EXAMPLE 2

Figure 3:
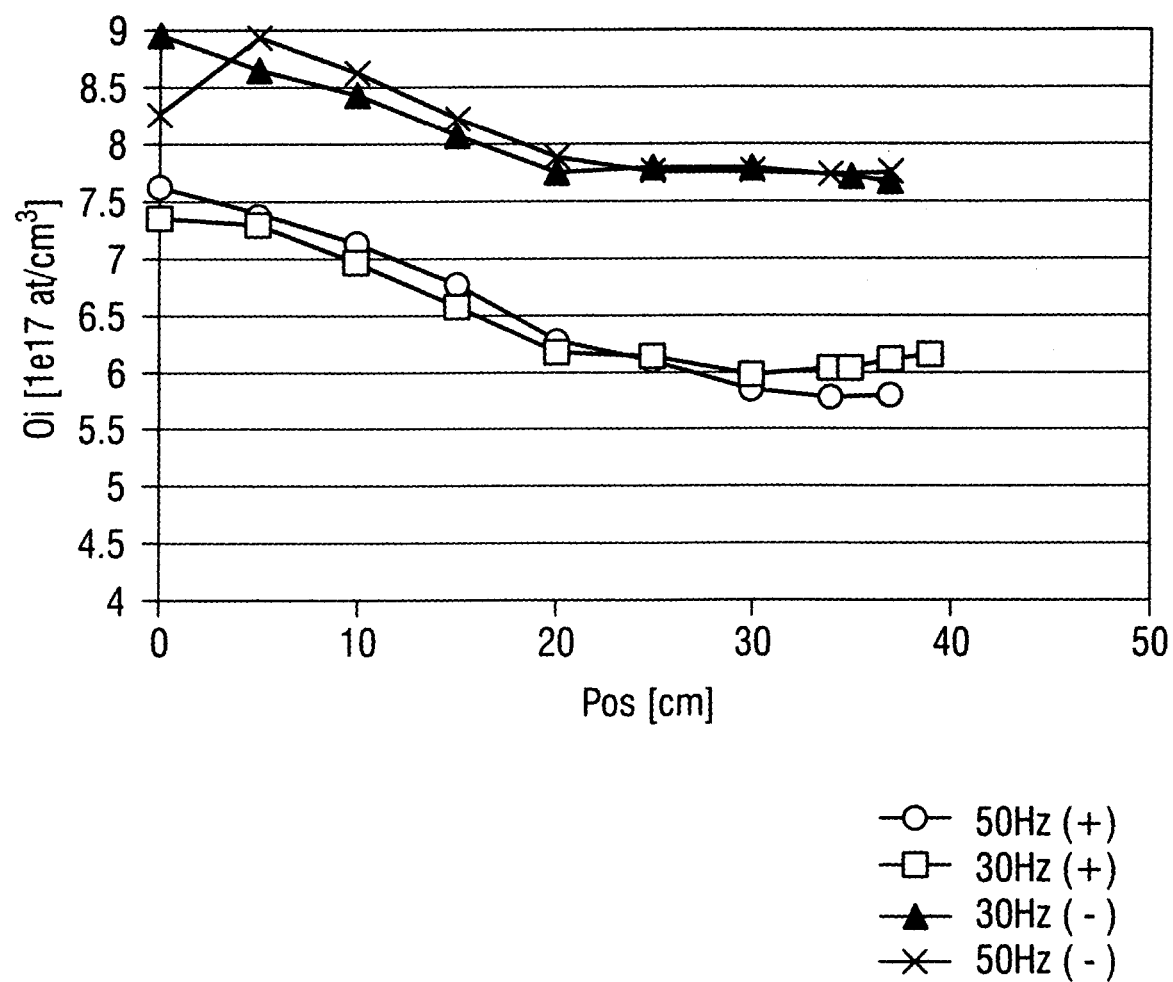
FIG. 3 shows an illustration of the oxygen concentration in the pulled single crystal as a function of the position of the single crystal in the longitudinal direction for four single crystals which have been pulled in accordance with the invention but using different variants of the invention.

An apparatus as shown in FIG. 1 having three coils each with 20 turns was used. The current intensities were 350 A in each coil, corresponding to 7000 ampere turns. The quartz crucible used had a diameter of 24 inches and contained a sufficient silicon melt to allow a single crystal with a diameter of 300 mm to be pulled. Four silicon single crystals were pulled under virtually identical conditions. Only the frequency and the direction of the traveling movement of the magnetic field differed. FIG. 3 makes it clear that the inclusion of oxygen in the single crystal is considerably higher if the force generated by the magnetic field is directed downward. By contrast, a change in frequency has only a slight effect on the oxygen concentration in the silicon single crystal.

EXAMPLE 3

Figure 4:
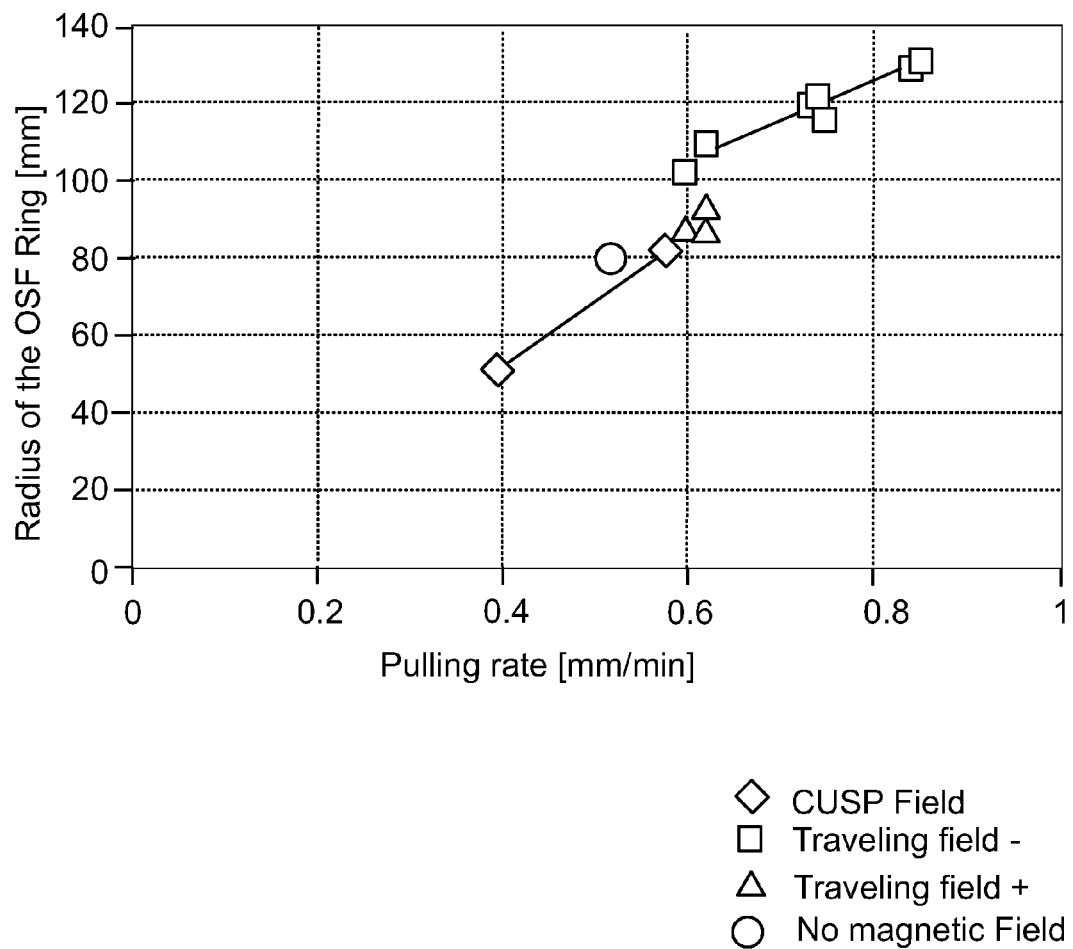
FIG. 4 shows the radius of the OSF ring as a function of the pulling rate up to a maximum possible pulling rate, with the process according to the invention being compared to processes which have previously been customary.

A plurality of silicon single crystals with a diameter of 300 mm were pulled under different conditions and at different pulling rates. The pulling rates were selected up to a rate which just still allowed a silicon single crystal of the desired round shape to be pulled. Four fundamentally different pulling conditions were investigated, specifically standard conditions without the application of a magnetic field; conditions under which the melt was under the influence of a static CUSP field; and conditions according to the invention with a traveling magnetic field and a force directed downward (−) or upward (+). For tests which took place under conditions according to the invention, an apparatus as shown in FIG. 1 with a coil system in accordance with Example 2 was used. In all cases, the crucible used had a diameter of 28 inches. FIG. 4 shows that the highest pulling rates can be achieved with the process according to the invention. It is most advantageous if the traveling magnetic field exerts a downwardly directed force on the melt. It is also under these conditions that the position of OSF ring is forced furthest outward.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a silicon single crystal, comprising pulling a silicon single crystal from a silicon melt which is contained in a crucible having a crucible wall and having a crucible diameter of at least 450 mm, placing a heat shield above said crucible; and said silicon single crystal being pulled with a diameter of at least 200 mm; and exposing the silicon melt to a magnetic field consisting of a traveling magnetic field which exerts a substantially vertically upward oriented force on the melt in a region of the crucible wall, and applying the magnetic field with an intensity which is sufficient to attenuate low-frequency temperature fluctuations in the melt.

* * * * *